US012717242B2

(12) United States Patent
Chang et al.

(10) Patent No.: US 12,717,242 B2
(45) Date of Patent: Aug. 25, 2026

(54) METHOD OF OPERATING SEMICONDUCTOR APPARATUS

(71) Applicant: TAIWAN SEMICONDUCTOR MANUFACTURING CO., LTD., Hsinchu (TW)

(72) Inventors: Shih-Ming Chang, Hsinchu County (TW); Chiu-Hsiang Chen, Hsinchu County (TW); Ru-Gun Liu, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/643,281

(22) Filed: Apr. 23, 2024

(65) Prior Publication Data

US 2024/0280910 A1 Aug. 22, 2024

Related U.S. Application Data

(62) Division of application No. 18/153,708, filed on Jan. 12, 2023, now Pat. No. 11,994,805, which is a division of application No. 17/411,571, filed on Aug. 25, 2021, now Pat. No. 11,586,115, which is a division of application No. 16/512,767, filed on Jul. 16, 2019, now Pat. No. 11,106,140.

(51) Int. Cl.
*G03F 7/00* (2006.01)
*G03F 7/20* (2006.01)

(52) U.S. Cl.
CPC ........ *G03F 7/70341* (2013.01); *G03F 7/2004* (2013.01); *G03F 7/2006* (2013.01); *G03F 7/2041* (2013.01)

(58) Field of Classification Search
CPC .. G03F 7/70341; G03F 7/2004; G03F 7/2006; G03F 7/2041; G03F 7/70716; G03F 7/70925; G03F 7/70875
See application file for complete search history.

(56) References Cited

U.S. PATENT DOCUMENTS 3,648,587 A 3/1972 Stevens
6,288,769 B1 9/2001 Akagawa et al.
6,781,673 B2 8/2004 Moors et al.
6,786,222 B2 9/2004 Frisa et al.
7,050,149 B2 * 5/2006 Owa .................. G03F 7/70808 355/71
7,875,864 B2 1/2011 Sogard
7,911,588 B2 3/2011 Yonekawa et al.
8,084,757 B2 12/2011 Wu et al.
8,764,995 B2 7/2014 Chang et al.
8,796,666 B1 8/2014 Huang et al.
8,828,625 B2 9/2014 Lu et al.
8,841,047 B2 9/2014 Yu et al.
8,877,409 B2 11/2014 Hsu et al.

(Continued)

*Primary Examiner* — Hung V Nguyen

(74) *Attorney, Agent, or Firm* — Birch, Stewart, Kolasch & Birch, LLP

(57) ABSTRACT

A method of operating a semiconductor apparatus includes generating an air flow that flows from a covering structure; causing a photomask to move over the covering structure such that particles attached to the photomask are blown away from the photomask by the air flow; and irradiating the photomask with light through a light transmission region of the covering structure.

20 Claims, 15 Drawing Sheets

(56) References Cited

U.S. PATENT DOCUMENTS

| | | | | |
|---|---|---|---|---|
| 9,093,530 | B2 | 7/2015 | Huang et al. | |
| 9,184,054 | B1 | 11/2015 | Huang et al. | |
| 9,256,123 | B2 | 2/2016 | Shih et al. | |
| 9,529,268 | B2 | 12/2016 | Chang et al. | |
| 9,548,303 | B2 | 1/2017 | Lee et al. | |
| 10,126,666 | B2 * | 11/2018 | Yoo | G03F 7/70875 |
| 10,678,149 | B2 * | 6/2020 | Alvarado | G03F 7/70908 |
| 11,333,984 | B2 | 5/2022 | Bruls et al. | |
| 2001/0026355 | A1 | 10/2001 | Aoki et al. | |
| 2001/0055101 | A1 | 12/2001 | Hayashi | |
| 2005/0007569 | A1 | 1/2005 | Streefkerk et al. | |
| 2009/0027635 | A1 | 1/2009 | De Jong et al. | |
| 2009/0168191 | A1 | 7/2009 | Takehisa et al. | |
| 2011/0211178 | A1 | 9/2011 | Sogard et al. | |
| 2013/0235357 | A1 | 9/2013 | Delgado et al. | |
| 2014/0253887 | A1 | 9/2014 | Wu et al. | |
| 2019/0146361 | A1 | 5/2019 | Chang | |
| 2019/0146362 | A1 | 5/2019 | Chen et al. | |

* cited by examiner

METHOD OF OPERATING SEMICONDUCTOR APPARATUS

RELATED APPLICATIONS

This present application is a divisional application of U.S. patent application Ser. No. 18/153,708, filed on Jan. 12, 2023, which is a divisional application of U.S. patent application Ser. No. 17/411,571, filed on Aug. 25, 2021, now U.S. Pat. No. 11,586,115, issued on Feb. 21, 2023, which is a divisional application of U.S. patent application Ser. No. 16/512,767, filed on Jul. 16, 2019, now U.S. Pat. No. 11,106,140, issued on Aug. 31, 2021, which is herein incorporated by reference.

BACKGROUND

In the manufacture of integrated circuits (IC), patterns representing different layers of the IC are fabricated using a series of reusable photomasks to transfer the design of each layer of the IC onto a semiconductor substrate during the manufacturing process in a photolithography process. These layers are built up using a sequence of processes and resulted in transistors and electrical circuits. However, as the IC sizes continue to shrink, meeting accuracy requirements as well as reliability in multiple layer fabrication has become increasingly more difficult. Photolithography uses an imaging system that directs radiation onto the photomask and then projects a shrunken image of the photomask onto a semiconductor wafer covered with photoresist. The radiation used in the photolithography may be at any suitable wavelength, with the resolution of the system increasing with decreasing wavelength. With the shrinkage in IC size, extreme ultraviolet (EUV) lithography becomes one of the technologies for smaller node device patterning.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
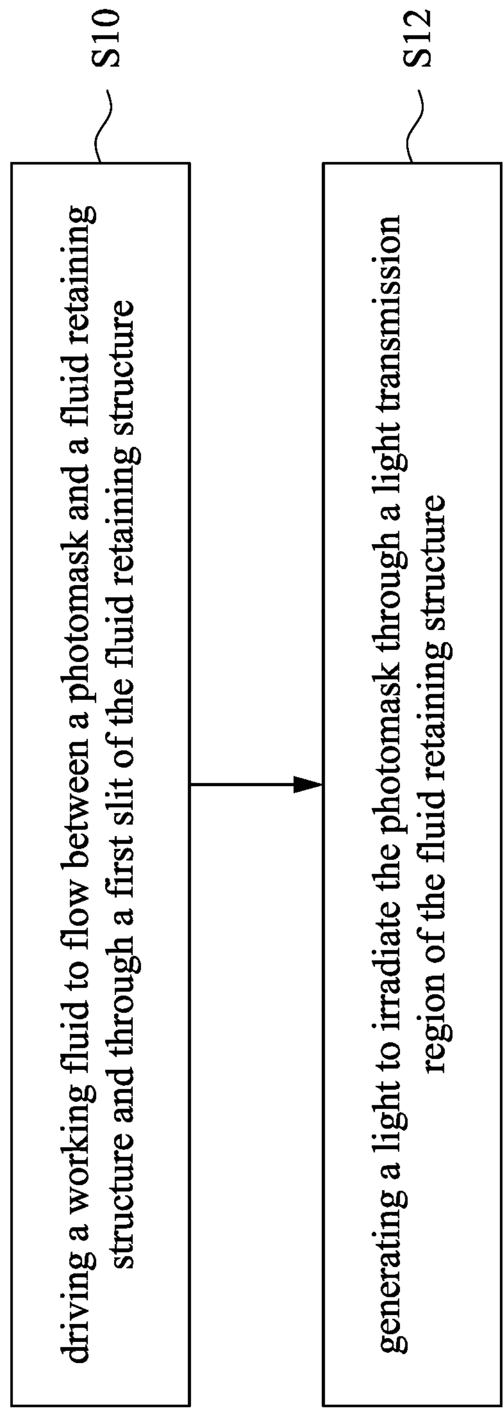
FIG. 1 is a flowchart illustrating a method of operating a semiconductor apparatus in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one component or feature’s relationship to another component(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, “around,” “about,” “substantially” or “approximately” shall generally mean within 20 percent, within 10 percent, or within 5 percent of a given value or range. Numerical quantities given herein are approximate; meaning that the term “around,” “about,” “substantially” or “approximately” can be inferred if not expressly stated.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

A reverse immersion lithography process (also referred to as a lithography process), method, and materials described in the current disclosure can be used in many applications. For example, the lithography process may be used in a deep ultraviolet (DUV) lithography or an extreme ultraviolet (EUV) lithography.

Regarding the DUV lithography and the EUV lithography, energy deposited onto the photomask during an exposure generates heat which causes thermal expansion and further induces critical dimension uniformity (CDU) error. Furthermore, heat generated may also bend the workpiece and make overlay error. Additionally, contaminants such as particles and residues may be introduced into the lithography apparatus and further contaminate the photomask and the semiconductor wafer to be processed therein. In an effort to adequately address the aforementioned issues, various semiconductor apparatuses and methods of operating the same for taking heat away from the photomask and removing particles and residues from the photomask surface are presented in accordance with various embodiments of the present disclosure as follows.

FIG. 1 is a flowchart illustrating a method of operating a semiconductor apparatus in accordance with some embodiments of the present disclosure. The method begins with block 10 in which a working fluid is driven to flow between a photomask and a fluid retaining structure and through a first slit of the fluid retaining structure, such that a boundary of the working fluid is confined between the photomask and the fluid retaining structure. The method continues with block 12 in which a light is generated to irradiate the photomask through a light transmission region of the fluid retaining structure. While the method is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases. It is noted that each method presented in the present disclosure is merely an example and not intended to limit the present disclosure beyond what is explicitly recited in the claims. Additional operations may be provided before, during, and after each of the methods. Some operations described may be replaced, eliminated, or moved around for additional embodiments of the fabrication process. Additionally, for clarity and ease of explanation, some elements of the figures have been simplified.

Figure 2:
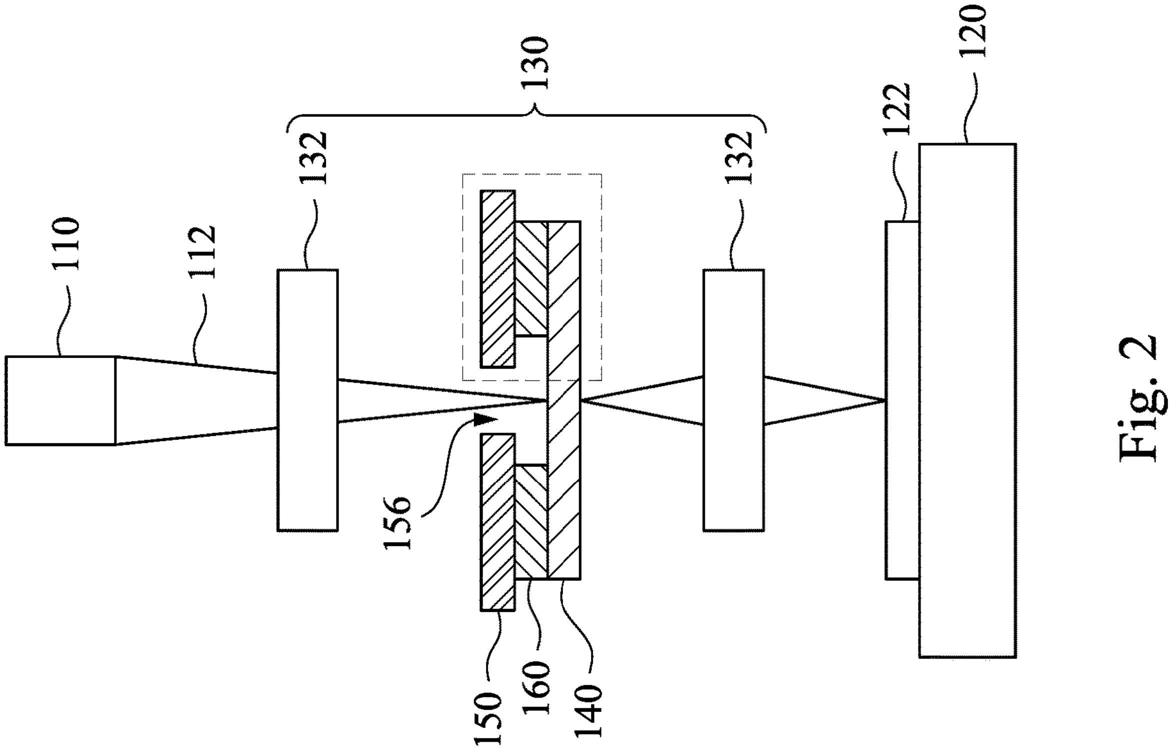
FIG. 2 is a schematic diagram illustrating a semiconductor apparatus used in a deep ultraviolet (DUV) lithography in accordance with some embodiments of the present disclosure.

FIG. 2 is a schematic diagram illustrating a semiconductor apparatus 100 used in a DUV lithography in accordance with some embodiments of the present disclosure. The semiconductor apparatus 100 is a reverse immersion lithography apparatus, such as a DUV lithography apparatus including a light source 110, a wafer stage 120, and an optical section 130. The light source 110 may be any source able to produce radiation beam 112 (also referred to as light 112) in the DUV wavelength range. One example of a suitable light source 110 is a krypton fluoride excimer providing a krypton fluoride laser (KrF laser). As another example, a suitable light source 110 may be an argon fluoride excimer providing an argon fluoride laser (ArF laser). It is noted that the semiconductor apparatus 100 used in the DUV lithography is carried out in an air environment.

A photomask 140 may be introduced into the semiconductor apparatus 100 during a lithography process. The photomask 140 is a transmissive mask including a transparent substrate and a patterned absorption layer. The photomask 140 may be positioned in space by one or more than one holding fixtures. Various holding and locking mechanisms can be used for the purpose of holding the photomask 140 in a predetermined location. The holding fixtures are operable to move the photomask 140 relative to the semiconductor apparatus 100. For example, the holding fixtures may be designed to be capable of moving the photomask 140 for scanning. The holding fixtures may include various components suitable to perform a precise movement.

A semiconductor wafer 122 (also referred to as a wafer 122) may be introduced into the semiconductor apparatus 100 during a lithography process. The wafer stage 120 is configured to hold the wafer 122 to be processed by the semiconductor apparatus 100 for patterning. The wafer stage 120 may be designed to be capable of moving the wafer 122 in a horizontal direction, such as a direction parallel to a side of the photomask 140. The wafer 122 may be positioned on the wafer stage 120 under the optical section 130. The optical section 130 may include one or more than one optical modules 132 placed at various positions within the semiconductor apparatus 100. For example, as shown in FIG. 2, the optical section 130 includes two optical modules 132 with one of which being placed between the light source 110 and the photomask 140, and the other of which being placed between the photomask 140 and the wafer stage 120. The optical section 130 receives the light 112 from the light source 110, modulates the light 112 by the image of the photomask 140, and directs the light 112 to a resist layer on the wafer 122. Each optical module 132 is designed to have a refractive mechanism in the semiconductor apparatus 100 used in the DUV lithography process. In some embodiments, the materials used for each optical module 132 may be chosen based on the wavelength of the light 112 used in a lithography process to minimize absorption and scattering.

The semiconductor apparatus 100 includes a fluid retaining structure 150 on the photomask 140. The fluid retaining structure 150 is configured to hold a working fluid 160, such as an immersion fluid. The working fluid 160 may be positioned between the photomask 140 and the fluid retaining structure 150. In other words, the photomask 140 and the fluid retaining structure 150 form an immersion region configured to contain the working fluid 160. The working fluid 160 may include water (water solution or de-ionized water) or other suitable fluid, but the present disclosure is not limited in this regard. In some embodiments, the fluid retaining structure 150 may be made of materials including metal, such as a metallic material, a plastic material with metal coated on its surface, a composite material with metal coated on its surface, or other suitable materials. The fluid retaining structure 150 may also be made of materials having low thermal expansion coefficient, such as a plastic material, a composite material, or other suitable materials.

Figure 3:
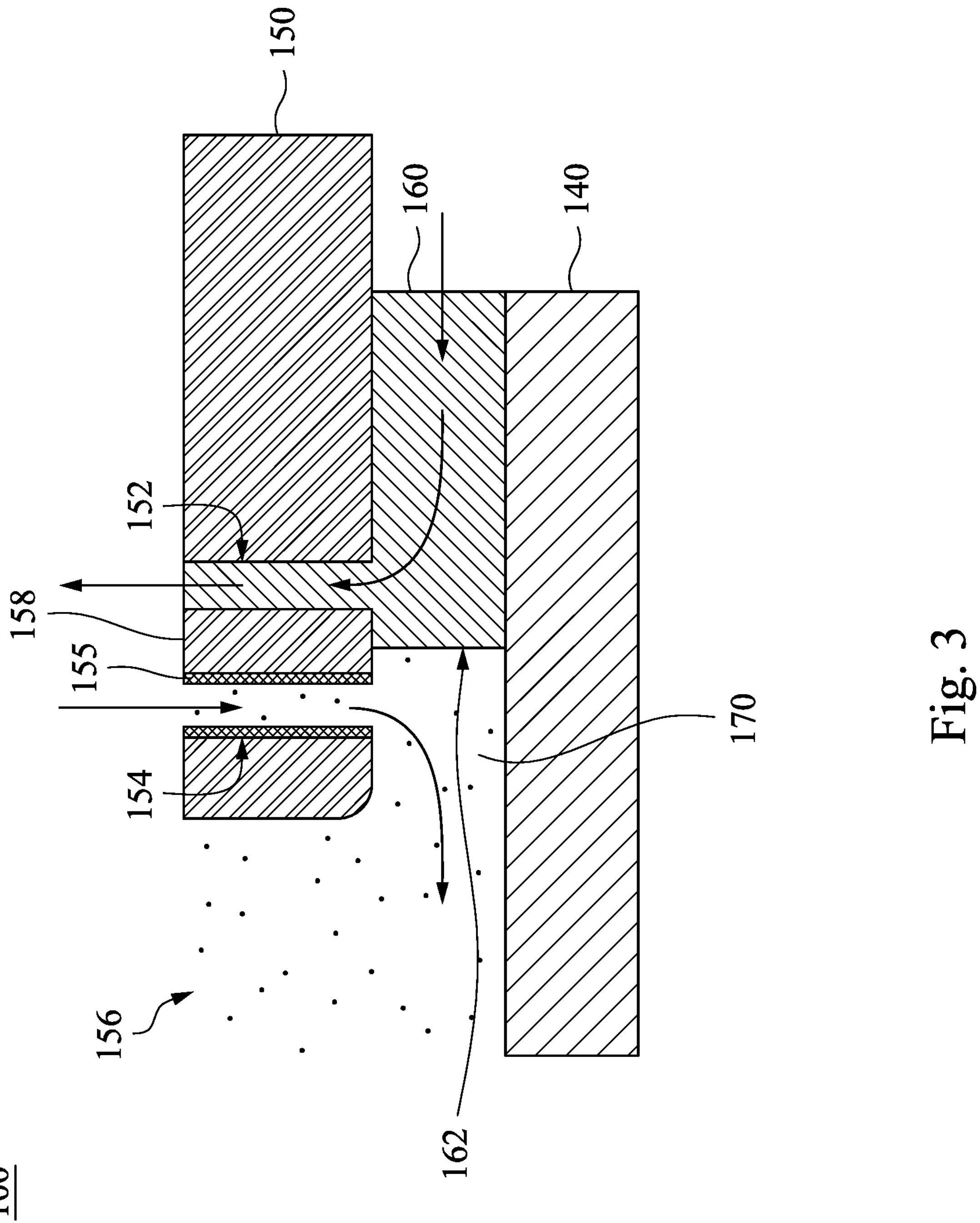
FIG. 3 is a partial enlargement diagram illustrating the semiconductor apparatus shown in FIG. 2 in accordance with some embodiments of the present disclosure.

FIG. 3 is a partial enlargement diagram illustrating the semiconductor apparatus 100 shown in FIG. 2 in accordance with some embodiments of the present disclosure. The fluid retaining structure 150 has a first slit 152 therein. In block 10 of FIG. 1, the working fluid 160 is driven to flow between the photomask 140 and the fluid retaining structure 150 and through the first slit 152 of the fluid retaining structure 150, such that a boundary 162 of the working fluid 160 is confined between the photomask 140 and the fluid retaining structure 150. When the semiconductor apparatus 100 is in operation, the working fluid 160 is driven to flow between the photomask 140 and the fluid retaining structure 150. The working fluid 160 can be recycled through the first slit 152 of the fluid retaining structure 150. The first slit 152 serves as an outlet of the working fluid 160 to transfer the working fluid 160 into an additional apparatus, such as a cooling device, a filter, a pump, or combinations thereof. A negative pressure may be applied to a top end of the first slit 152 of the fluid retaining structure 150 to provide a pumping force to the working fluid 160, such that the working fluid 160 is sucked by the negative pressure and flows through the first slit 152 of the fluid retaining structure 150 into the additional apparatus. The negative pressure may be provided by a pump or the like. After the working fluid 160 passes through the additional apparatus, the working fluid 160 may be driven back to flow between the photomask 140 and the fluid retaining structure 150. For example, the working fluid 160 can be driven back by passing through other slit(s) or channel(s). In other words, the working fluid 160 is recycled from the first slit 152 of the fluid retaining structure 150 to be continuously reused within the semiconductor apparatus 100.

In some embodiments, the fluid retaining structure 150 may further include a second slit 154 as a working gas inlet. A pipe 155 may be optionally disposed in the second slit 154. A working gas 170 may include air, noble gas, other suitable gas, or combinations thereof, but the present disclosure is not limited in this regard. A positive pressure may be applied to a top end of the second slit 154 of the fluid retaining structure 150, such that the working gas 170 is driven to flow toward the photomask 140 from the second slit 154 of the fluid retaining structure 150. In some embodiments, the positive pressure may be provided by a pump or the like, and a value of the positive pressure is larger than about 1 atm. The working gas 170 through the second slit 154 and the working fluid 160 through the first slit 152 respectively flow in two opposite directions. For example, the working gas 170 through the second slit 154 flows toward the photomask 140 (e.g., a downward direction) while the working fluid 160 through the first slit 152 flows away from the photomask 140 (e.g., an upward direction). The working gas 170 contacts the boundary 162 of the working fluid 160 and serves as an "air knife" to confine the boundary 162 of the working fluid 160 between the photomask 140 and the fluid retaining structure 150, such that the working fluid 160 may not easily escape from space that is between the photomask 140 and the fluid retaining structure 150, and may be used repeatedly in cycles. In some embodiments, a position of the boundary 162 of the working fluid 160 can be controlled and determined by the negative pressure and the positive pressure respectively applied to the first slit 152 and the second slit 154. For example, if the value of the negative pressure applied to the working fluid 160 in the first slit 152 is greater than the value of the positive pressure applied to the working gas 170 in the second slit 154, the position of the boundary 162 of the working fluid 160 may be closer to the first slit 152 than the second slit 154; if the value of the negative pressure applied to the working fluid 160 in the first slit 152 is smaller than the value of the positive pressure applied to the working gas 170 in the second slit 154, the position of the boundary 162 of the working fluid 160 may be closer to the second slit 154 than the first slit 152. In some embodiments, the boundary 162 of the working fluid 160 may be substantially straight and substantially perpendicular to the photomask 140.

Reference is made to FIGS. 2 and 3. The fluid retaining structure 150 may include a light transmission region 156. In block 12 of FIG. 1, the light 112 is generated to irradiate the photomask 140 through the light transmission region 156 of the fluid retaining structure 150. The light 112 generated by the light source 110 passes through the light transmission region 156, and irradiates a portion of the photomask 140 exposed through the light transmission region 156 of the fluid retaining structure 150. In some embodiments, the second slit 154 of the fluid retaining structure 150 is between the first slit 152 and the light transmission region 156 of the fluid retaining structure 150. Additionally, a portion 158 of the fluid retaining structure 150 is between the first slit 152 and the second slit 154 of the fluid retaining structure 150. Stated differently, the portion 158 of the fluid retaining structure 150 is between the first slit 152 and the light transmission region 156 of the fluid retaining structure 150. The boundary 162 of the working fluid 160 is confined between the photomask 140 and the portion 158 of the fluid retaining structure 150. Furthermore, the working gas 170 mentioned above flows through the second slit 154 of the fluid retaining structure 150 toward the photomask 140 and out of the light transmission region 156 of the fluid retaining structure 150.

When the semiconductor apparatus 100 is in operation, the light 112 in the DUV wavelength range generated by the light source 110 irradiates a portion of the photomask 140 through the light transmission region 156 of the fluid retaining structure 150, and is transmitted onto the wafer 122 to create a pattern. In the meanwhile, the working fluid 160 flows over the photomask 140 and is in contact with the photomask 140. As a result, heat of the photomask 140 generated by the light 112 during an exposure of the lithography process can be taken away by the working fluid 160. It is noted that a temperature of the working fluid 160 within the semiconductor apparatus 100 is lower than a temperature of the photomask 140 during the lithography process. The working fluid 160 is then sucked by a negative pressure and flows out of the first slit 152 of the fluid retaining structure 150 to be treated by a cooling process. The cooled-down working fluid 160 then flows back to space between the photomask 140 and the fluid retaining structure 150 to take heat away from the photomask 140 again. As a result, a working area of the photomask 140 exposed through the light transmission region 156 of the fluid retaining structure 150 is kept opened while other areas of the photomask 140 are immerged under the working fluid 160 for cooling.

Figure 5:
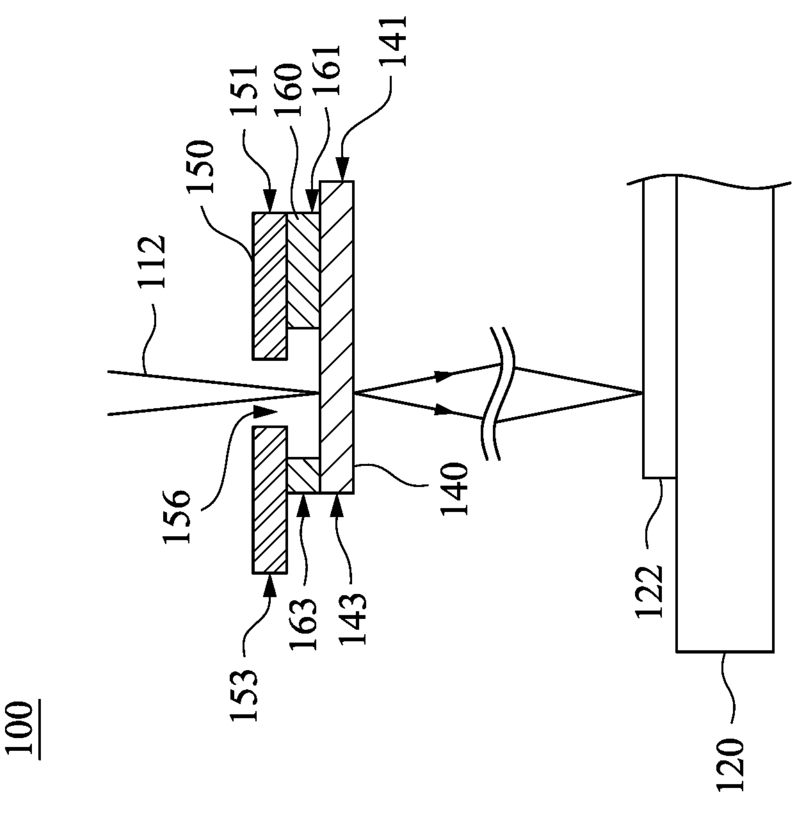
FIGS. 4 and 5 are schematic diagrams illustrating the semiconductor apparatus shown in FIG. 2 at various stages in accordance with some embodiments of the present disclosure.
Figure 4:
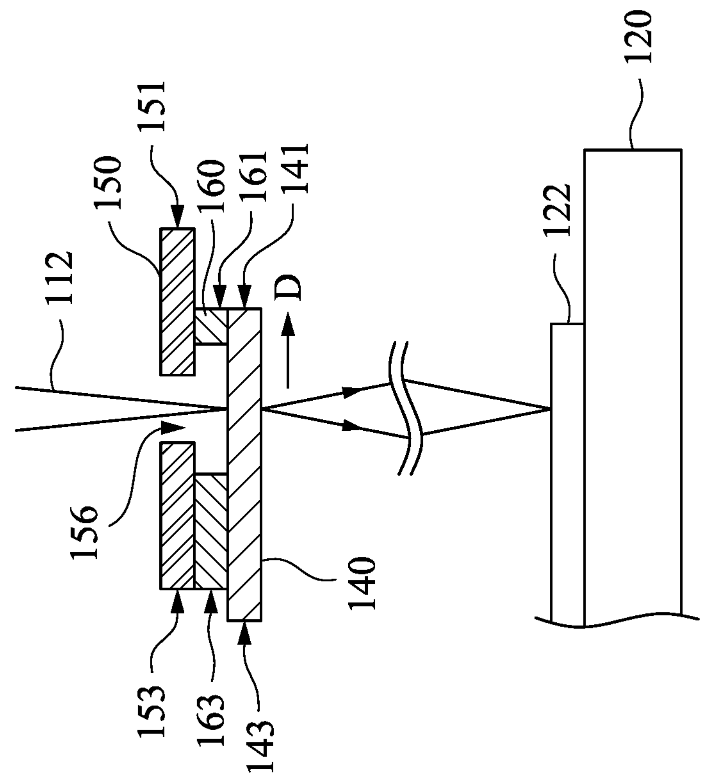

FIGS. 4 and 5 are schematic diagrams illustrating the semiconductor apparatus 100 shown in FIG. 2 at various stages in accordance with some embodiments of the present disclosure. When the semiconductor apparatus 100 is in operation, the photomask 140 is moved in a direction D (also referred to as a scanning direction) along a side of the fluid retaining structure 150 by holding fixtures. During an exposure, the fluid retaining structure 150 is fixed at a specific position. When the photomask 140 is moved in the scanning direction D, different portions of the photomask 140 are sequentially exposed through the light transmission region 156 to receive the light 112 such that patterns on different portions of the photomask 140 are sequentially transferred from the photomask 140 to corresponding target portions of the wafer 122.

Furthermore, positions of the working fluid 160 are controlled based on positions of the photomask 140 when the photomask 140 is moved in the scanning direction D. For example, as shown in FIG. 4, an outer boundary 161 of the working fluid 160 is controlled to be substantially aligned with a boundary 141 of the photomask 140, and an outer boundary 163 of the working fluid 160 is controlled to be substantially aligned with a boundary 153 of the fluid retaining structure 150. After the photomask 140 is moved, as shown in FIG. 5, the outer boundary 161 of the working fluid 160 is controlled to be substantially aligned with a boundary 151 of the fluid retaining structure 150, and the outer boundary 163 of the working fluid 160 is controlled to be substantially aligned with a boundary 143 of the photomask 140. As a result of such a configuration, contact areas between the working fluid 160 and the photomask 140 can be increased to facilitate heat dissipation. In some embodiments, when the photomask 140 is at an initial position as shown in FIG. 4, an amount of the working fluid 160 at the right side of the light transmission region 156 is smaller than an amount of the working fluid 160 at the left side of the light transmission region 156. As the photomask 140 moves in the scanning direction D to reach a final position as shown in FIG. 5, an amount of the working fluid 160 at the right side of the light transmission region 156 is larger than an amount of the working fluid 160 at the left side of the light transmission region 156.

Figure 6:
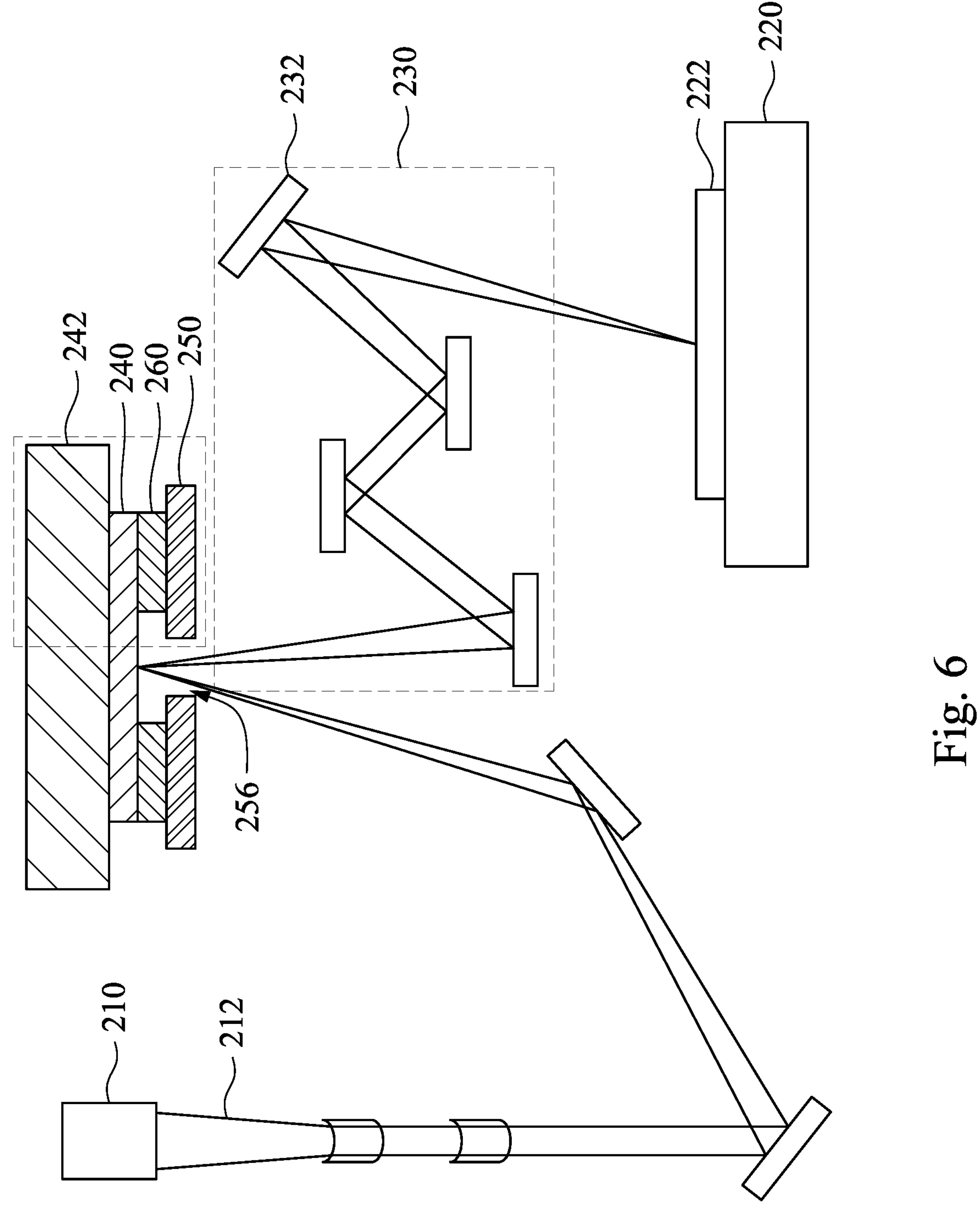
FIG. 6 is a schematic diagram illustrating a semiconductor apparatus used in an extreme ultraviolet (EUV) lithography in accordance with some embodiments of the present disclosure.

FIG. 6 is a schematic diagram illustrating a semiconductor apparatus 200 used in an EUV lithography in accordance with some embodiments of the present disclosure. The semiconductor apparatus 200 is a reverse immersion lithography apparatus, such as an EUV lithography apparatus. The semiconductor apparatus 200 includes a light source 210, a wafer stage 220, an optical section 230, and a mask stage 242. The light source 210 may be any source able to produce radiation beam 212 (also referred to as light 212) in the EUV wavelength range. One example of a suitable light source 210 is creating plasma when a laser illuminates a gas, such as a supersonic jet of xenon gas. As another example, a suitable light source 210 may be using bending magnets and undulators associated with synchrotrons. As a further example, a suitable light source 210 may be using discharge sources, which have the potential to provide adequate power in the desired wavelength range. EUV radiation is strongly absorbed in virtually all transmissive materials, including gases and glasses. To minimize unwanted absorption, the semiconductor apparatus 200 used in the EUV lithography is carried out in near vacuum.

A photomask 240 and a wafer 222 may be introduced into the semiconductor apparatus 200 during a lithography process, and the wafer stage 220 is configured to hold the wafer 222 to be processed by the semiconductor apparatus 200 for patterning. The wafer stage 220 may be designed to be capable of moving the wafer 222 in a horizontal direction, such as a direction parallel to a side of the photomask 240. Since the photomask 240 herein is a reflective mask, the semiconductor apparatus 200 further includes the mask stage 242. The photomask 240 is secured to the mask stage 242 by various holding and locking mechanisms. The mask stage 242 may be designed to be capable of moving the photomask 240 for scanning. Furthermore, the optical section 230 in the semiconductor apparatus 200 is reflective because of the absorption associated with EUV radiation. Accordingly, the optical section 230 includes reflection mirrors 232 that project radiation reflected from the mask stage 242 onto the wafer 222.

The semiconductor apparatus 200 includes a fluid retaining structure 250 on a bottom of the photomask 240. The fluid retaining structure 250 is configured to hold a working fluid 260, such as an immersion fluid. The working fluid 260 may be positioned between the photomask 240 and the fluid retaining structure 250. Stated differently, the photomask 240 is positioned between the mask stage 242 and the working fluid 260. In comparison with the working fluid 160 shown in FIG. 2, the working fluid 260 may include materials with high vapor pressures and high cohesions, one example of a suitable working fluid 260 is mercury (Hg), in which the vapor pressure of mercury is about 2E-3 mmHg at about 26° C.

The materials used for the working fluid 260 should be chosen based on characteristics of high vapor pressures to minimize the disruption of the vacuum environment to further ensure the environment being continuously maintained at near vacuum during a lithography process.

Figure 7:
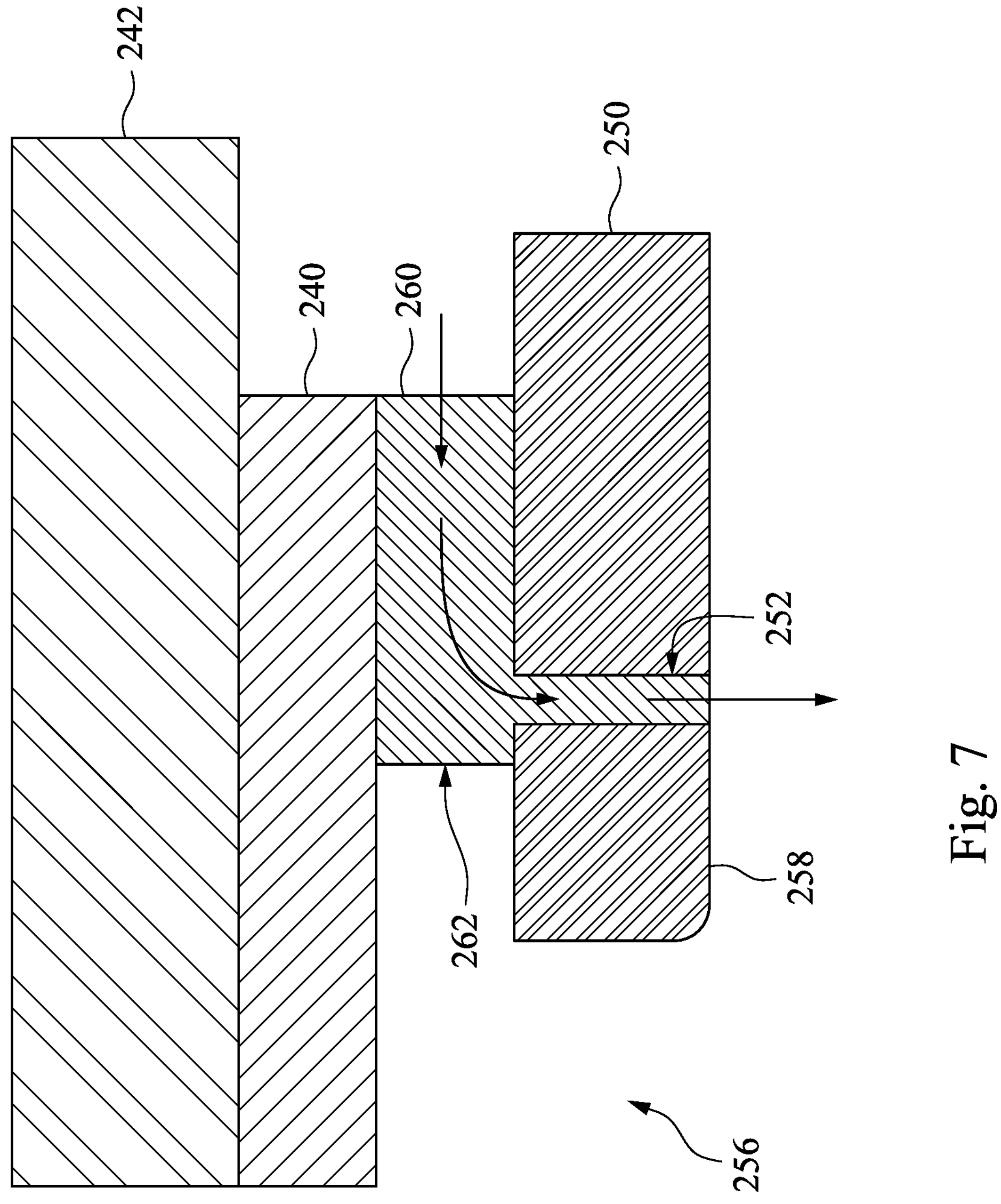
FIG. 7 is a partial enlargement diagram illustrating the semiconductor apparatus shown in FIG. 6 in accordance with some embodiments of the present disclosure.

FIG. 7 is a partial enlargement diagram illustrating the semiconductor apparatus 200 shown in FIG. 6 in accordance with some embodiments of the present disclosure. The fluid retaining structure 250 has a first slit 252 therein. In block 10 of FIG. 1, the working fluid 260 is driven to flow between the photomask 240 and the fluid retaining structure 250 and through a first slit 252 of the fluid retaining structure 250, such that a boundary 262 of the working fluid 260 is confined between the photomask 240 and the fluid retaining structure 250. When the semiconductor apparatus 200 is in operation, the working fluid 260 is driven to flow between the photomask 240 and the fluid retaining structure 250. The first slit 252 serves as an outlet of the working fluid 260 to transfer the working fluid 260 into an additional apparatus, such as a cooling device, a filter, a pump, or combinations thereof. A negative pressure may be applied to a bottom end of the first slit 252 of the fluid retaining structure 250 to provide a pumping force to the working fluid 260, such that the working fluid 260 is sucked by the negative pressure and flows through the first slit 252 into the additional apparatus. The negative pressure may be provided by a pump or the like. After the working fluid 260 passes through the additional apparatus, the working fluid 260 may be driven back to flow between the photomask 240 and the fluid retaining structure 250. In other words, the working fluid 260 is recycled from the first slit 252 of the fluid retaining structure 250 to be continuously reused within the semiconductor apparatus 200.

In comparison with the semiconductor apparatus 100 of FIG. 3, no working gas is introduced in the semiconductor apparatus 200 because the EUV lithography is performed in a near-vacuum environment. Therefore, the fluid retaining structure 250 has no second slit between the first slit 252 and a light transmission region 256. That is to say, the boundary 262 of the working fluid 260 is confined between the photomask 240 and the fluid retaining structure 250 without a working gas. Instead, the boundary 262 of the working fluid 260 is confined by taking advantage of its characteristic of high cohesions and controlling a value of a negative pressure applied to the first slit 252 to suck the working fluid 260. For example, if the value of the negative pressure of the working fluid 260 is larger, the position of the boundary 262 of the working fluid 260 may be closer to the first slit 252; if the value of the negative pressure of the working fluid 260 is smaller, the position of the boundary 262 of the working fluid 260 may be farther from the first slit 252.

Reference is made to FIGS. 6 and 7. The fluid retaining structure 250 may include the light transmission region 256. In block 12 of FIG. 1, the light 212 is generated to irradiate the photomask 240 through a light transmission region 256 of the fluid retaining structure 250. The light 212 generated by the light source 210 passes through the light transmission region 256, and irradiates a portion of the photomask 240 exposed through the light transmission region 256 of the fluid retaining structure 250. In some embodiments, a portion 258 of the fluid retaining structure 250 is between the first slit 252 and the light transmission region 256 of the fluid retaining structure 250. The boundary 262 of the working fluid 260 is confined between the portion 258 of the fluid retaining structure 250 and the photomask 240. Furthermore, the boundary 262 of the working fluid 260 is confined between the first slit 252 and the light transmission region 256 of the fluid retaining structure 250.

When the semiconductor apparatus 200 is in operation, the light 212 in the EUV wavelength range generated by the light source 210 irradiates a portion of the photomask 240 through the light transmission region 256 of the fluid retaining structure 250, and is reflected onto the wafer 222 to create a pattern in a target portion of the wafer 222. In the meanwhile, the working fluid 260 is driven to flow in cycles and in contact with the photomask 240, such that heat of the photomask 240 generated by the light 212 during an exposure of the lithography process can be taken away by the working fluid 260. In addition, heat of the photomask 240 generated by the light 212 may further be taken away by a heat conduction from the photomask 240 to the mask stage 242 in contact with the photomask 240.

Figure 9:
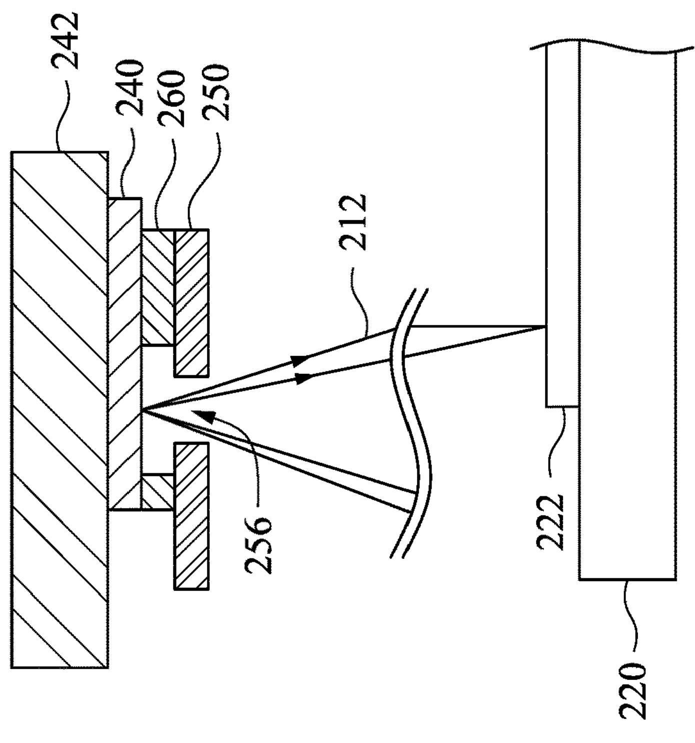
FIGS. 8 and 9 are schematic diagrams illustrating the semiconductor apparatus shown in FIG. 6 at various stages in accordance with some embodiments of the present disclosure.
Figure 8:
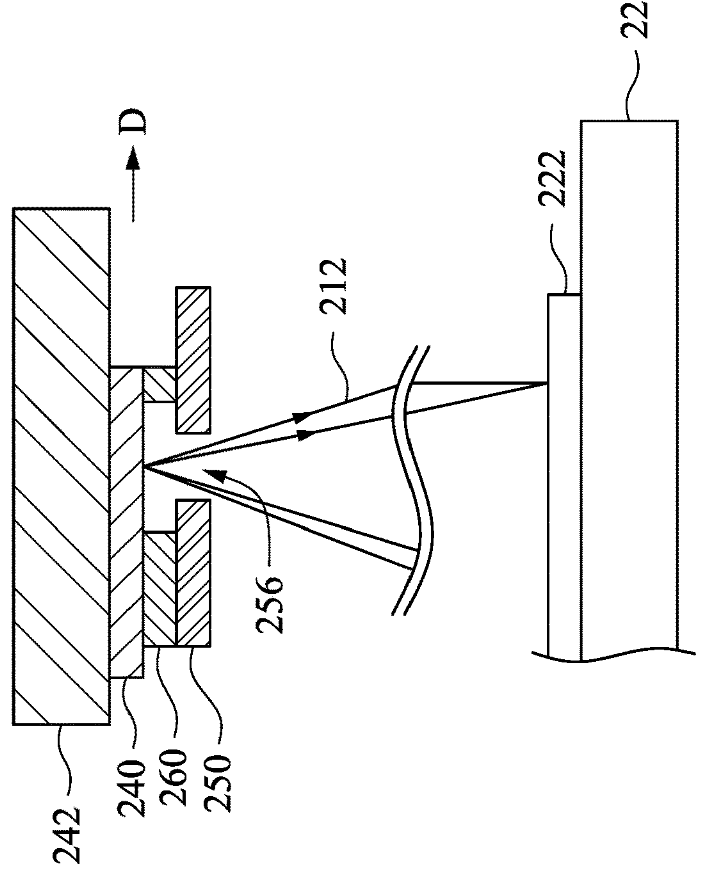

FIGS. 8 and 9 are schematic diagrams illustrating the semiconductor apparatus 200 shown in FIG. 6 at various stages in accordance with some embodiments of the present disclosure. When the semiconductor apparatus 200 is in operation, the photomask 240 secured on the mask stage 242 is moved in a direction D (also referred to as a scanning direction) along a side of the fluid retaining structure 250. As such, different portions of the photomask 240 are sequentially exposed through the light transmission region 256 to receive the light 212, such that patterns on different portions of the photomask 240 are sequentially transferred from the photomask 240 to corresponding target portions of the wafer 222. Similar to the aforementioned semiconductor apparatus 100, positions of the working fluid 260 are controlled based on positions of the photomask 240 when the photomask 240 is moved in the scanning direction.

Figure 10:
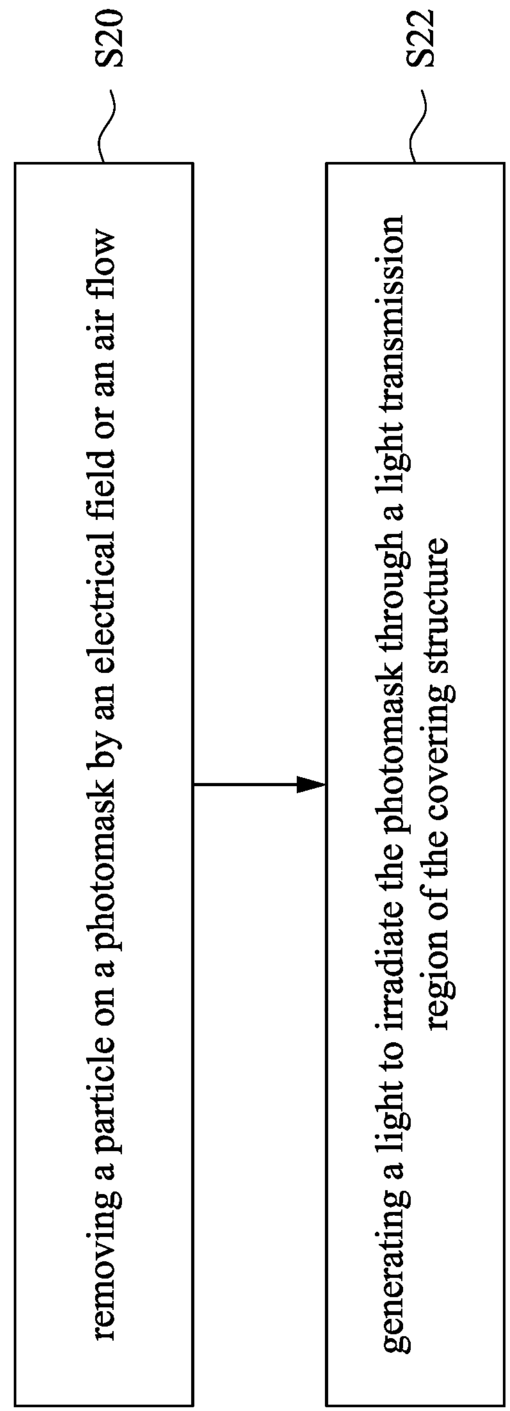
FIG. 10 is a flowchart illustrating a method of operating a semiconductor apparatus in accordance with some embodiments of the present disclosure.

FIG. 10 is a flowchart illustrating a method of operating a semiconductor apparatus in accordance with some embodiments of the present disclosure. The method begins with block 20 in which a particle is removed on a photomask by an electrical field or an air flow, in which the electrical field or the air flow is formed by at least one covering structure adjacent to the photomask. The method continues with block 22 in which a light is generated to irradiate the photomask through a light transmission region of the covering structure. While the method is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 11:
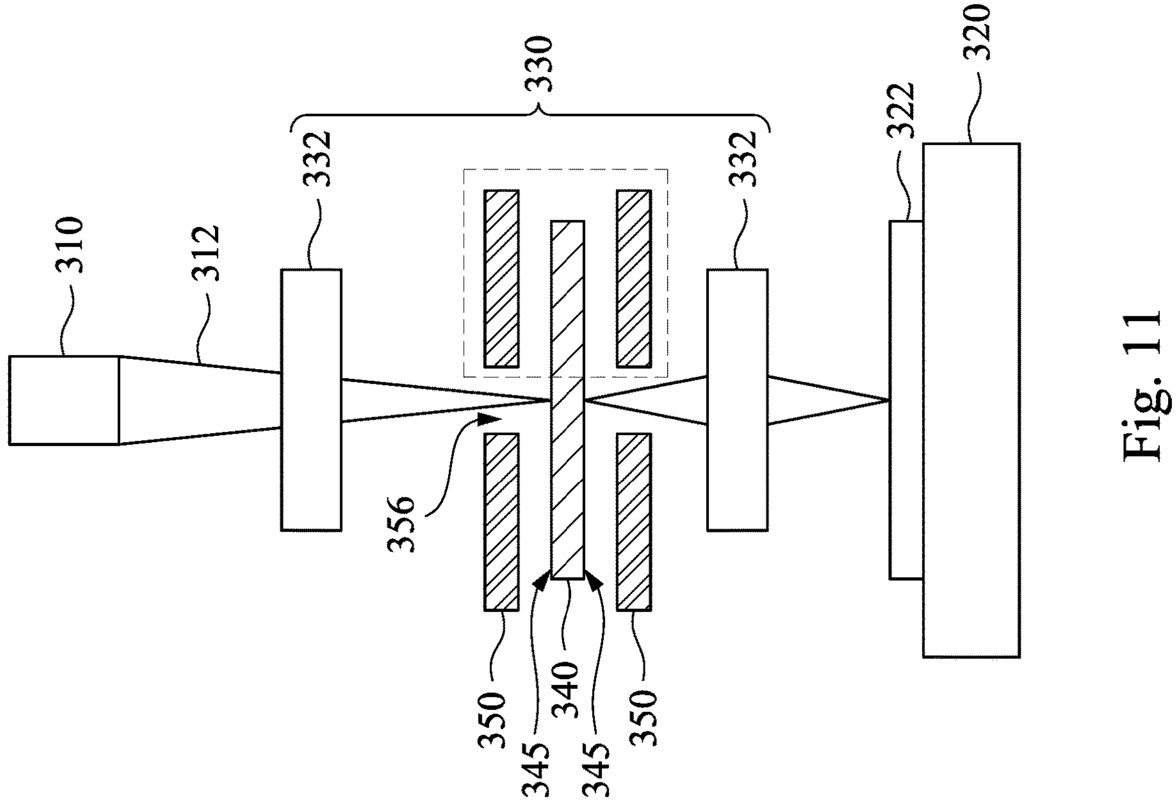
FIG. 11 is a schematic diagram illustrating a semiconductor apparatus used in a DUV lithography in accordance with some embodiments of the present disclosure.

FIG. 11 is a schematic diagram illustrating a semiconductor apparatus 300 used in a DUV lithography in accordance with some embodiments of the present disclosure. The semiconductor apparatus 300 is a reverse immersion lithography apparatus, such as a DUV lithography apparatus. Since some components of the semiconductor apparatus 300 illustrated in FIG. 11 are similar to those corresponding components of the semiconductor apparatus 100 illustrated FIG. 2, descriptions for those similar components will not be repeated hereinafter. In comparison with the semiconductor apparatus 100, a working fluid and a working gas are not used in the semiconductor apparatus 300. Accordingly, a fluid retaining structure 350 herein is referred to as a "covering structure" since there's no working fluid to be retained. Furthermore, the covering structure 350 has no slit therein. In some embodiments, the semiconductor apparatus 300 includes two covering structures 350 respectively on two opposite sides 345 of a photomask 340. In other words, the photomask 340 may be positioned between the two covering structures 350.

Figure 12:
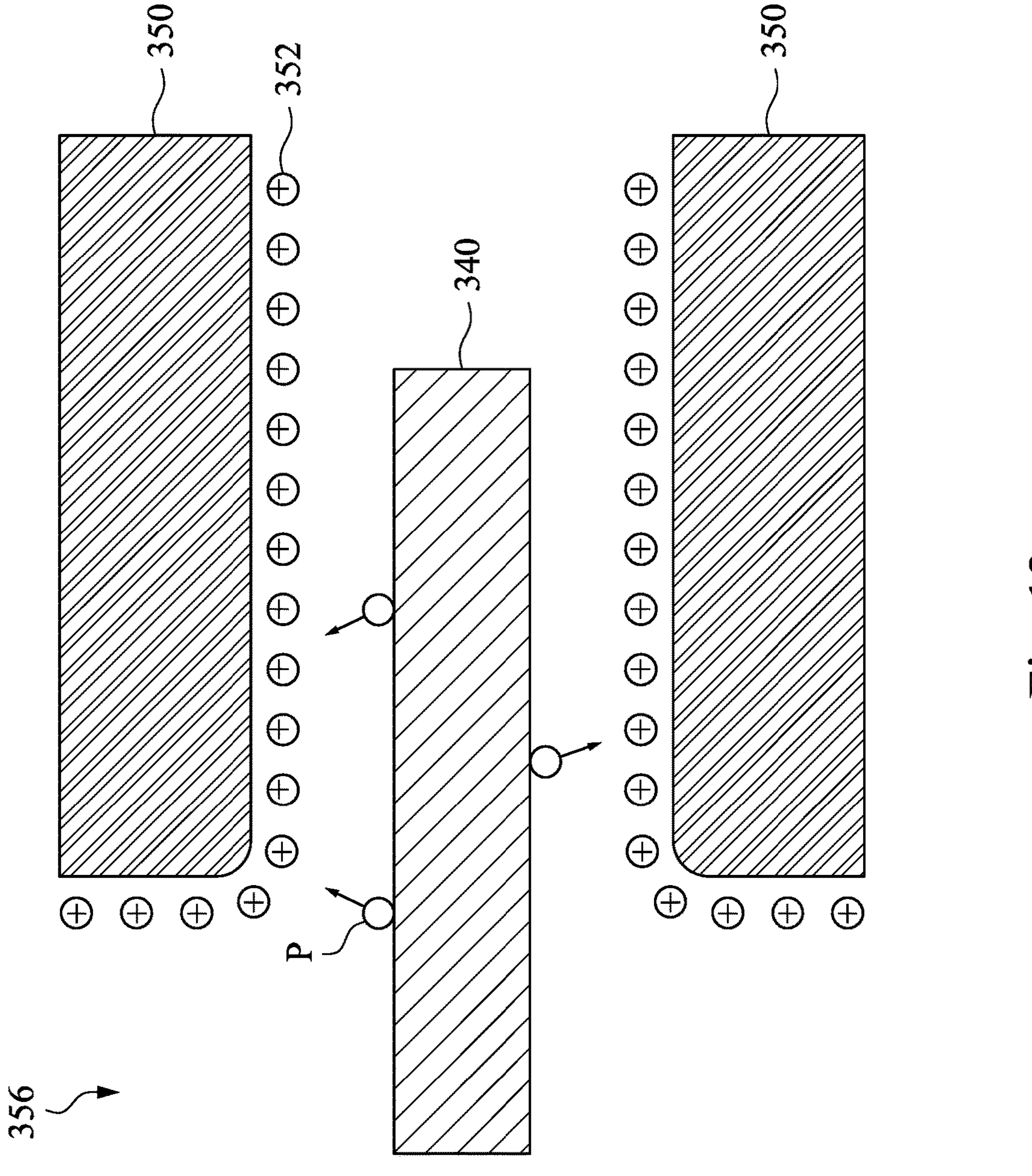
FIG. 12 is a partial enlargement diagram illustrating the semiconductor apparatus shown in FIG. 11 in accordance with some embodiments of the present disclosure.

FIG. 12 is a partial enlargement diagram illustrating the semiconductor apparatus 300 shown in FIG. 11 in accordance with some embodiments of the present disclosure. In block 20 of FIG. 10, a particle P on the photomask 340 is removed by an electrical field, in which the electrical field is formed by at least one covering structure 350 adjacent to the photomask 340. The particle(s) P herein may be charged particle(s) P such as fall-on particle(s) or chemical residue (s), but the present disclosure is not limited in this regard. In some embodiments, the covering structure 350 may be made of materials including metal, such as a metallic material, a plastic material with metal coated on its surface, a composite material with metal coated on its surface, or other suitable materials.

In some embodiments, a gap may be preserved between the covering structure 350 and the photomask 340 to ensure that the covering structure 350 is spaced apart from the photomask 340. When the semiconductor apparatus 300 is in operation, at least one covering structure 350 may be charged to form charges 352 thereon to attract the particle(s) P from the photomask 340. In some embodiments, a voltage may be applied to the covering structure 350. Subsequently, an electric field may be generated in a peripheral area of the covering structure 350 through the applied voltage to further generate charges 352 on the covering structure 350. In some embodiments, when the charges 352 formed on the covering structure 350 is electrically positive and the particle(s) P is electrically negative, the particle(s) P would be attracted onto the covering structure 350 through the electric field. In alternative embodiments, when the charges 352 formed on the covering structure 350 is electrically negative and the particle(s) P is electrically positive, the particle(s) P would be attracted onto the covering structure 350 through the electric field.

Reference is made to FIGS. 11 and 12. The covering structure 350 may include a light transmission region 356. In block 22 of FIG. 10, a light 312 is generated to irradiate the photomask 340 through the light transmission region 356 of the covering structure 350. The light 312 in the DUV wavelength range generated by the light source 310 passes through the light transmission region 356 of the covering structure 350, and irradiates a portion of the photomask 340 exposed through the light transmission region 356 of the covering structure 350. When the semiconductor apparatus 300 is in operation, the light 312 generated by the light source 310 irradiates a portion of the photomask 340 through the light transmission region 356 of the covering structure 350, and is transmitted onto the wafer 322 to create a pattern. In the meanwhile, the charges 352 formed on the covering structure 350 removes the particle(s) P from the photomask 340 by the electrical field. As a result, a working area of the photomask 340 exposed through the light transmission region 356 of the covering structure 350 is kept opened while other areas of the photomask 340 are under a cleaning process. In other words, a lithography process may be carried out simultaneously with the cleaning process of the photomask 340.

Figure 14:
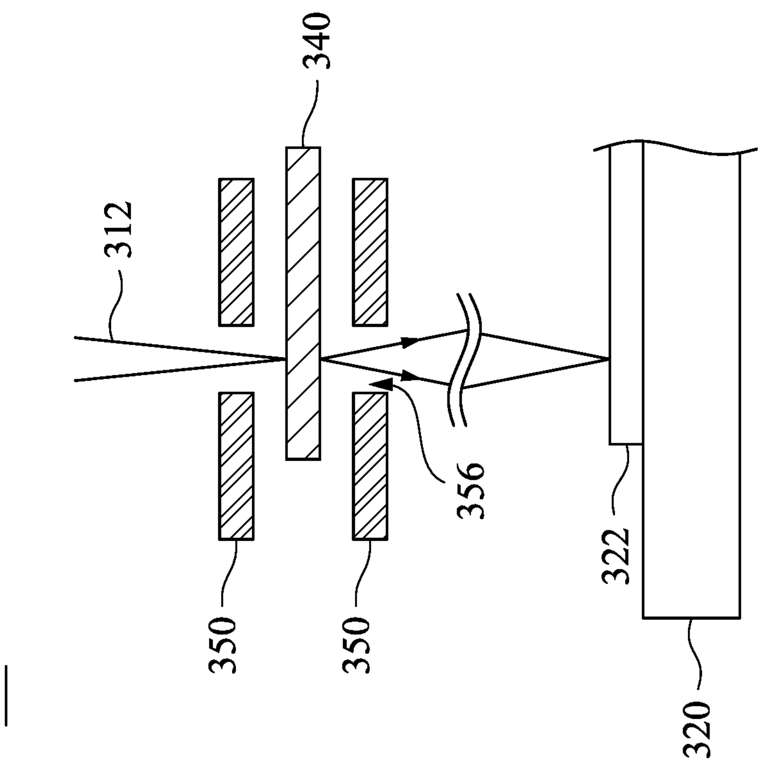
FIGS. 13 and 14 are schematic diagrams illustrating the semiconductor apparatus shown in FIG. 11 at various stages in accordance with some embodiments of the present disclosure.
Figure 13:
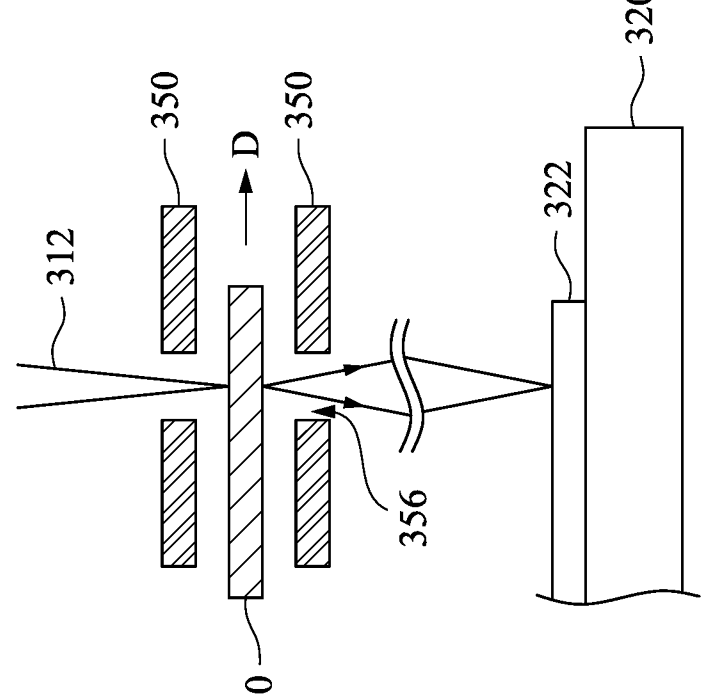

FIGS. 13 and 14 are schematic diagrams illustrating the semiconductor apparatus 300 shown in FIG. 11 at various stages in accordance with some embodiments of the present disclosure. When the semiconductor apparatus 300 is in operation, the photomask 340 is moved in a direction D (also referred to as a scanning direction) along a side of the covering structure 350 to sequentially transfer patterns from the photomask 340 to the wafer 322. In some embodiments, a number of the covering structure 350 is two, and the photomask 340 is moved between the two covering structures 350 such that particles on both sides of the photomask 340 can be removed during the lithography process.

Figure 15:
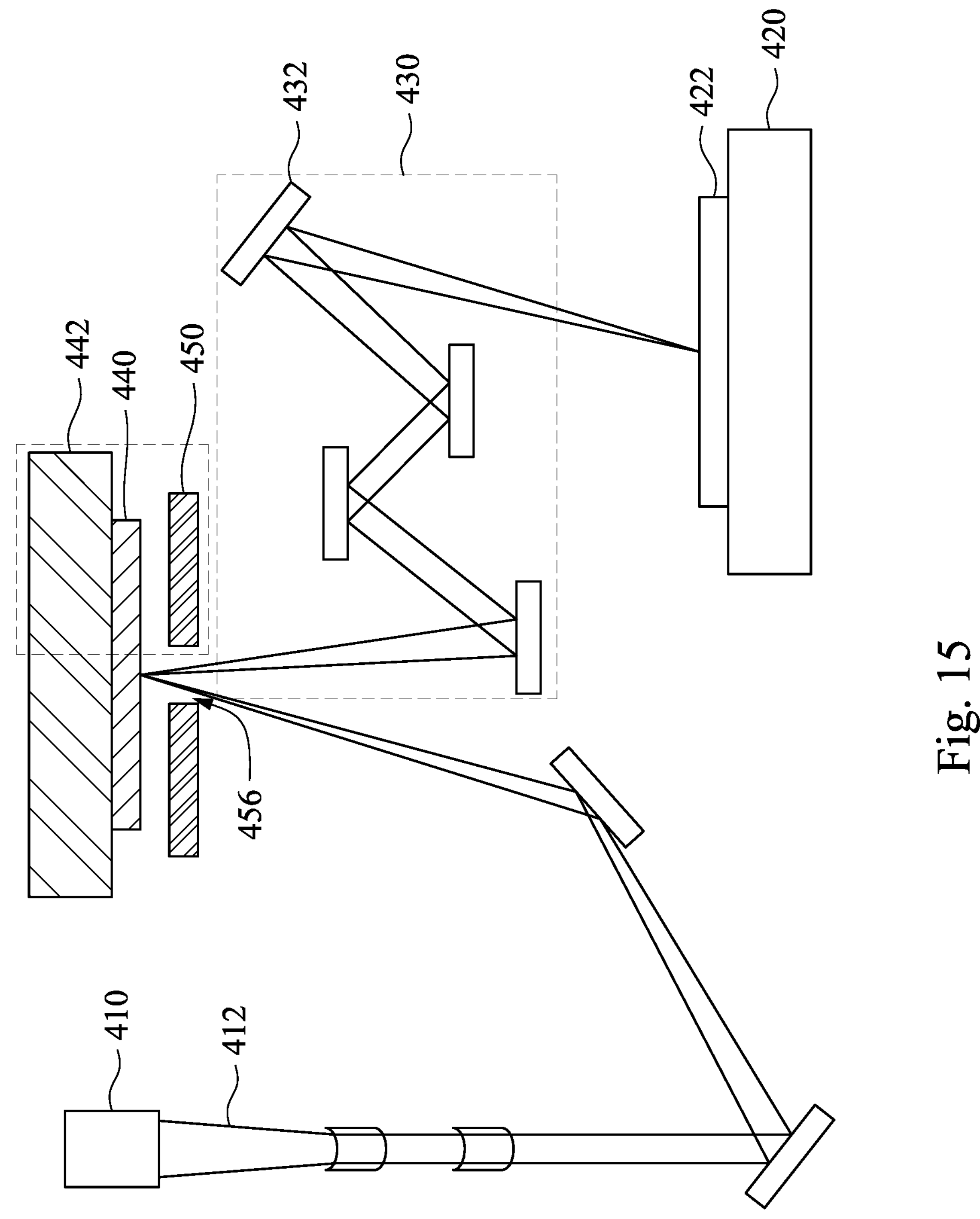
FIG. 15 is a schematic diagram illustrating a semiconductor apparatus used in an EUV lithography in accordance with some embodiments of the present disclosure.

FIG. 15 is a schematic diagram illustrating a semiconductor apparatus 400 used in an EUV lithography in accordance with some embodiments of the present disclosure. The semiconductor apparatus 400 is a reverse immersion lithography apparatus, such as an EUV lithography apparatus. In comparison with the aforementioned semiconductor apparatus 300, the semiconductor apparatus 400 is used in an EUV lithography process. Furthermore, since the semiconductor apparatus 400 includes a mask stage 442 above a photomask 440, one covering structure 450 is located below the mask stage 442 and the photomask 440. In other words, the photomask 440 is positioned between the covering structure 450 and the mask stage 442.

Figure 16:
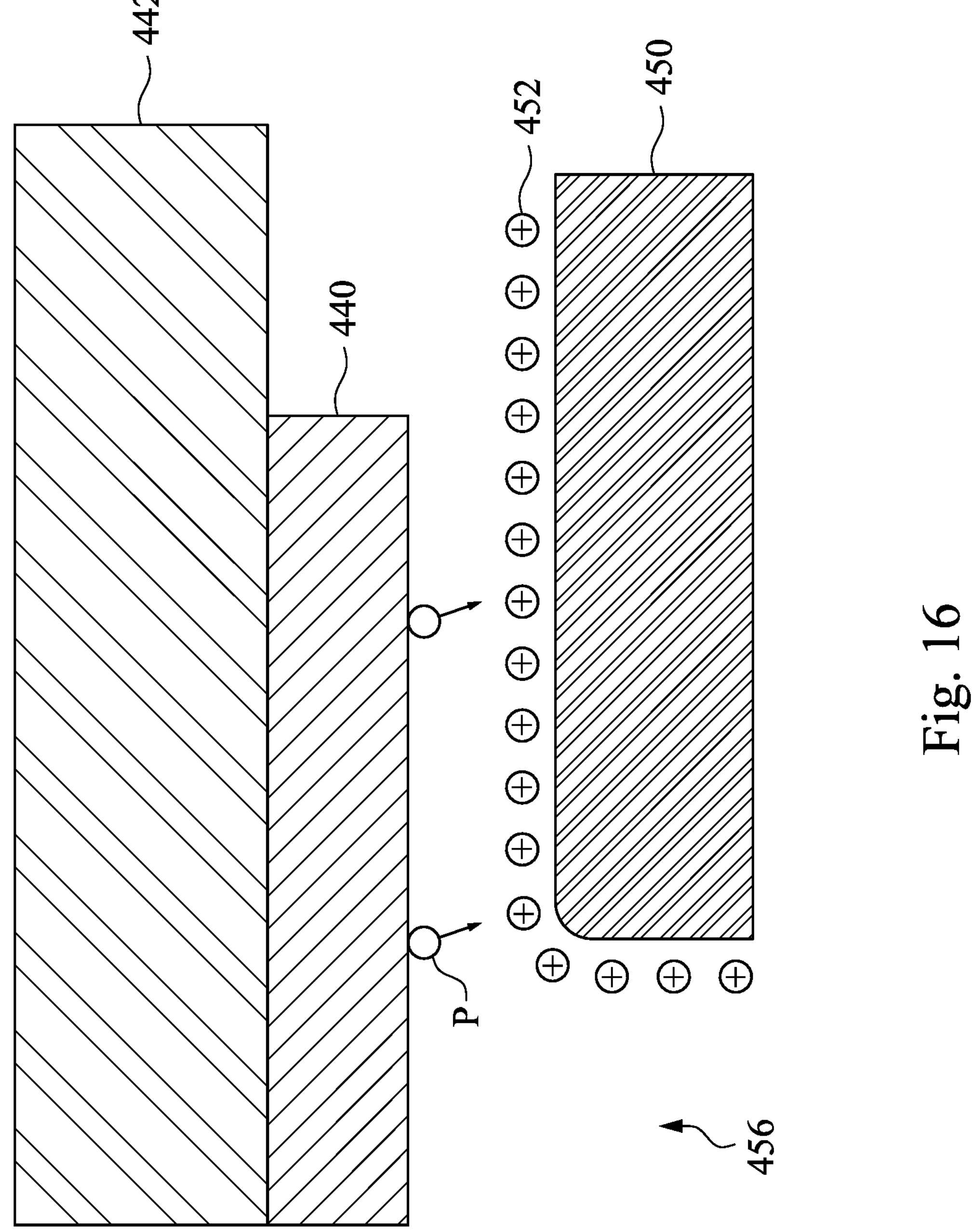
FIG. 16 is a partial enlargement diagram illustrating the semiconductor apparatus shown in FIG. 15 in accordance with some embodiments of the present disclosure.

FIG. 16 is a partial enlargement diagram illustrating the semiconductor apparatus 400 shown in FIG. 15 in accordance with some embodiments of the present disclosure. In block 20 of FIG. 10, a particle P on the photomask 440 is removed by the electrical field, in which the electrical field is formed by at least one covering structure 450 adjacent to the photomask 440. The particle(s) P herein may be charged particle(s) P such as fall-on particle(s) or chemical residue (s), but the present disclosure is not limited in this regard. When the semiconductor apparatus 400 is in operation, the covering structure 450 may be charged to form charges 452 thereon to attract the charged particle(s) P from the photomask 440. In some embodiments, a voltage may be applied to the covering structure 450 to further generate charges 452 on the covering structure 450. In some embodiments, when the charges 452 formed on the covering structure 450 is electrically positive and the particle(s) P is electrically negative, the particle(s) P would be attracted onto the covering structure 450 through the electric field. In alternative embodiments, when the charges 452 formed on the covering structure 450 is electrically negative and the particle(s) P is electrically positive, the particle(s) P would be attracted onto the covering structure 450 through the electric field.

Figure 17:
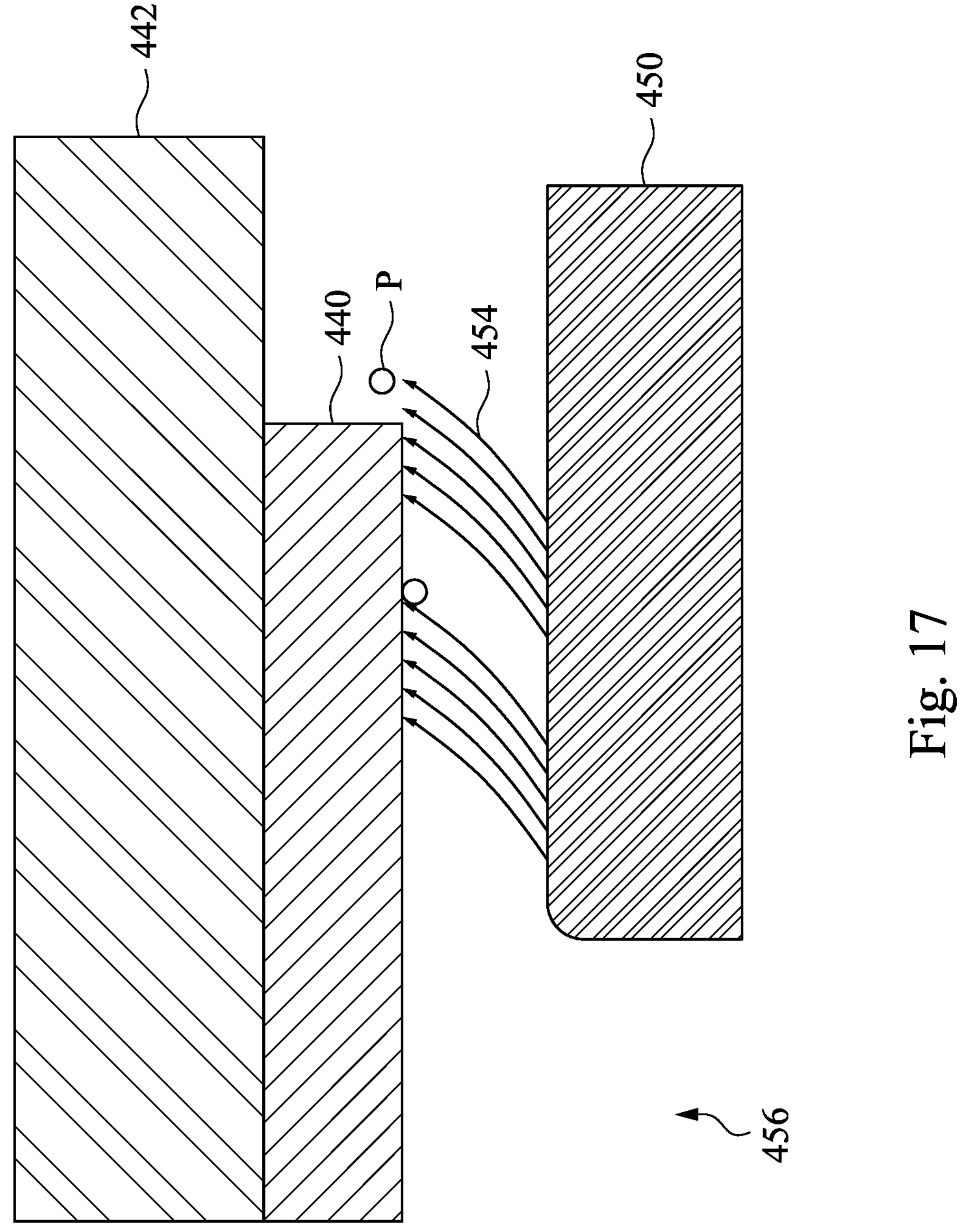
FIG. 17 is a partial enlargement diagram illustrating the semiconductor apparatus shown in FIG. 15 in accordance with some embodiments of the present disclosure.

FIG. 17 is a partial enlargement diagram illustrating the semiconductor apparatus 400 shown in FIG. 15 in accordance with some embodiments of the present disclosure. In block 22 of FIG. 10, a particle P on the photomask 440 may be alternatively removed by an air flow 454, in which the air flow 454 is formed by at least one covering structure 450 adjacent to the photomask 440. The particle(s) P herein may be charged particle(s) P or neutral particle(s) P, such as fall-on particle(s) or chemical residue(s), but the present disclosure is not limited in this regard. In some embodiments, the air flow 454 may be confined by the covering structure 450. Accordingly, a confined air flow 454 may be formed from the covering structure 450 to the photomask 440, such that the particle(s) P on the photomask 440 is detached from the photomask 440. In alternative embodiments, the air flow 454 may be ionized by the covering structure 450. Accordingly, an ionized air flow 454 may be formed from the covering structure 450 to the photomask 440 to achieve the aforementioned effects. It is noted that the air flow 454 is provided at a low pressure to ensure the environment being continuously maintained at near vacuum during a lithography process.

In other embodiments, particle(s) P on the photomask 440 may be removed by an applied magnetic field. The particle (s) P herein may be charged particle(s) P such as fall-on particle(s) or chemical residue(s), but the present disclosure is not limited in this regard. For example, the magnetic field is generated to be adjacent to the covering structure 450, such that the particle(s) P is driven away from the photomask 440 due to Lorentz force (or electromagnetic force). More specifically, the Lorentz force is a combination of electric force and magnetic force exerted on a charged object due to electric field and magnetic field. In some embodiments, using the electrical field and/or the magnetic field can control and confine the ionized air flow 454 in a vacuum environment.

Reference is made to FIGS. 15-17. The covering structure 450 may include a light transmission region 456. In block 22 of FIG. 10, a light 412 is generated to irradiate the photomask 440 through the light transmission region 456 of the covering structure 450. When the semiconductor apparatus 400 is in operation, the light 412 in the EUV wavelength range generated by the light source 410 irradiates a portion of the photomask 440 through the light transmission region 456 of the covering structure 450, and is reflected onto the wafer 422 to create a pattern. In the meanwhile, the charges 452 formed on the covering structure 450 removes the particle(s) P from the photomask 440 by the electric field or the air flow 454. As a result, the lithography process herein may be carried out simultaneously with a cleaning process of the photomask 440.

Figure 19:
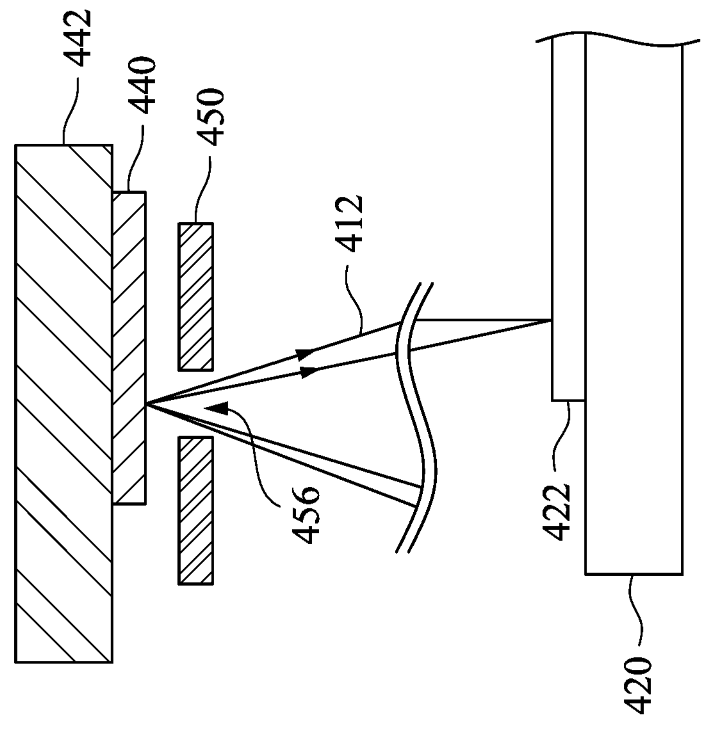
FIGS. 18 and 19 are schematic diagrams illustrating the semiconductor apparatus shown in FIG. 15 at various stages in accordance with some embodiments of the present disclosure.
Figure 18:
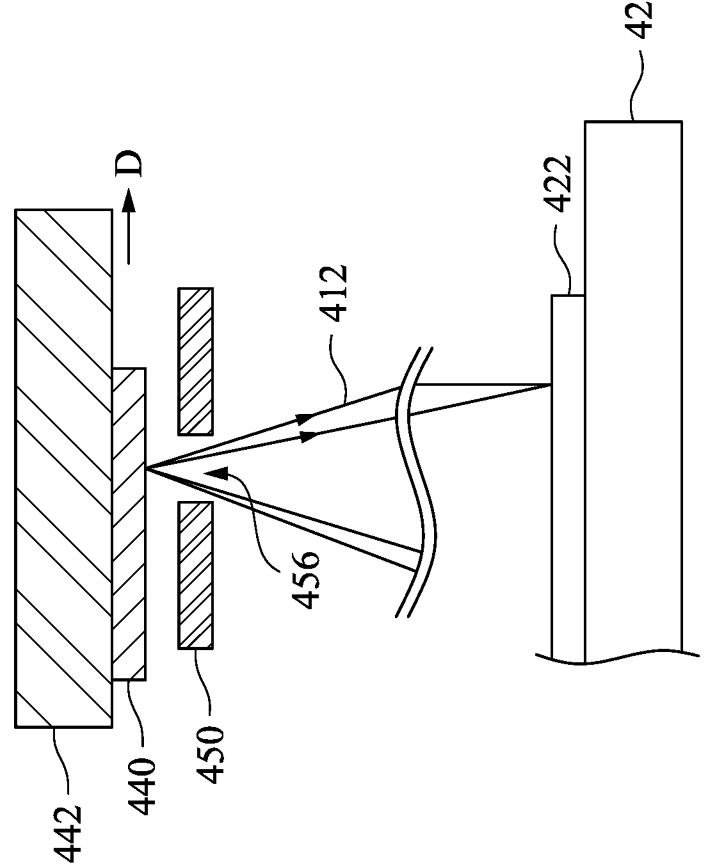

FIGS. 18 and 19 are schematic diagrams illustrating the semiconductor apparatus 400 shown in FIG. 15 at various stages in accordance with some embodiments of the present disclosure. Similar to the aforementioned semiconductor apparatus 300, when the semiconductor apparatus 400 is in operation, the photomask 440 below the mask stage 442 is moved in a direction D (also referred to as a scanning direction) along a side of the covering structure 450 to sequentially transfer patterns from the photomask 440 to the wafer 422.

Based on the aforementioned descriptions, various advantages may be provided by the present disclosure. More specifically, since heat may be generated on the photomask during an exposure of the lithography process, thermal expansion may occurs and thereby inducing critical dimension uniformity (CDU) error. Furthermore, particle(s) on the photomask may result in photomask particulate contamination and thereby causing wafer yield loss. However, the present disclosure may take heat away from the photomask by driving the working fluid to flow between the photomask and the fluid retaining structure. Additionally, the present disclosure may also utilize electric field, air flow, or magnetic field within the semiconductor apparatus to attract or guide away the particle(s) from the photomask surface. As such, a working area of the photomask is kept opened while other areas of the photomask are under the cooling/cleaning process. Therefore, heat generated may be efficiently taken away and the particle(s) on the photomask may be efficiently removed such that wafer yield will be improved.

In some embodiments, a method includes driving a working fluid to flow between a photomask and a fluid retaining structure and through a first slit of the fluid retaining structure, such that a boundary of the working fluid is confined between the photomask and the fluid retaining structure; and generating a light to irradiate the photomask through a light transmission region of the fluid retaining structure.

In some embodiments, a method includes removing a particle on a photomask by an electrical field or an air flow, in which the electrical field or the air flow is formed by at least one covering structure adjacent to the photomask; and generating a light to irradiate the photomask through a light transmission region of the covering structure.

In some embodiments, an apparatus includes a photomask, a fluid retaining structure, a working fluid, and a light source. The fluid retaining structure is on the photomask and has a light transmission region and a first slit. The working fluid flows between the photomask and the fluid retaining structure and through the first slit, in which a boundary of the working fluid is confined between the photomask and a portion of the fluid retaining structure, and the portion is between the light transmission region and the first slit. The light source is configured to irradiate a portion of the photomask exposed through the light transmission region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

guiding an air flow flowing through a pipe in a covering structure to a top surface of a photomask, wherein the air flow is guided by a pump, the pipe in the covering structure is perpendicular to the top surface of the photomask, and the covering structure is spaced apart from the photomask;

irradiating the photomask with a light source through a light transmission region of the covering structure; and causing the photomask to move relative to the covering structure during irradiating the photomask.

2. The method of claim 1, wherein generating the air flow and causing the photomask to move over the covering structure are performed simultaneously.

3. The method of claim 1, further comprising driving a working fluid to flow between the photomask and the covering structure, wherein the air flow confines a boundary of the working fluid.

4. The method of claim 3, wherein the working fluid flows through a slit of the covering structure.

5. The method of claim 4, wherein the pipe is laterally between the slit and the light transmission region.

6. The method of claim 4, wherein the air flow in the pipe and the working fluid in the slit flow in opposite directions.

7. The method of claim 4, wherein the covering structure is disposed between the photomask and the light source.

8. A method comprising:

guiding an air flow flowing through a pipe in a covering structure to a top surface of a photomask, wherein the air flow is guided by a pump, the pipe in the covering structure is perpendicular to the top surface of the photomask, and the covering structure is spaced apart from the photomask;

irradiating the photomask with a light source through a light transmission region of the covering structure, wherein the light source is a deep ultraviolet (DUV) light source; and causing the photomask to move relative to the covering structure during irradiating the photomask.

9. The method of claim 8, wherein generating the air flow and causing the photomask to move over the covering structure are performed simultaneously.

10. The method of claim 8, further comprising driving a working fluid to flow between the photomask and the covering structure, wherein the air flow confines a boundary of the working fluid.

11. The method of claim 10, wherein the working fluid flows through a slit of the covering structure.

12. The method of claim 11, wherein the pipe is laterally between the slit and the light transmission region.

13. The method of claim 11, wherein the air flow in the pipe and the working fluid in the slit flow in opposite directions.

14. The method of claim 11, wherein the covering structure is disposed between the photomask and the light source.

15. A method comprising:

guiding an air flow flowing through a pipe in a covering structure to a top surface of a photomask, wherein the air flow is guided by a pump, the pipe in the covering structure is perpendicular to the top surface of the photomask, and the covering structure is spaced apart from the photomask, and wherein the covering structure comprises metal;

irradiating the photomask with a light source through a light transmission region of the covering structure; and causing the photomask to move relative to the covering structure during irradiating the photomask.

16. The method of claim 15, wherein generating the air flow and causing the photomask to move over the covering structure are performed simultaneously.

17. The method of claim 15, further comprising driving a working fluid to flow between the photomask and the covering structure, wherein the air flow confines a boundary of the working fluid.

18. The method of claim 17, wherein the working fluid flows through a slit of the covering structure.

19. The method of claim 18, wherein the pipe is laterally between the slit and the light transmission region.

20. The method of claim 18, wherein the air flow in the pipe and the working fluid in the slit flow in opposite directions.

* * * * *